United States Patent
Pickett et al.

(10) Patent No.: US 8,614,432 B2
(45) Date of Patent: Dec. 24, 2013

(54) CRYSTALLINE SILICON-BASED MEMRISTIVE DEVICE WITH MULTIPLE MOBILE DOPANT SPECIES

(75) Inventors: Matthew D Pickett, San Francisco, CA (US); Duncan Stewart, Ottawa (CA)

(73) Assignee: Hewlett-Packard Development Company, L.P., Houston, TX (US)

( * ) Notice: Subject to any disclaimer, the term of this patent is extended or adjusted under 35 U.S.C. 154(b) by 268 days.

(21) Appl. No.: 13/139,557

(22) PCT Filed: Jan. 15, 2009

(86) PCT No.: PCT/US2009/031140
§ 371 (c)(1),
(2), (4) Date: Jun. 14, 2011

(87) PCT Pub. No.: WO2010/082928
PCT Pub. Date: Jul. 22, 2010

(65) Prior Publication Data
US 2011/0240941 A1   Oct. 6, 2011

(51) Int. Cl.
*H01L 47/00* (2006.01)
(52) U.S. Cl.
USPC .......... 257/1; 257/4; 257/5; 257/E45.002; 365/148; 438/382
(58) Field of Classification Search
USPC ........ 257/1, 4, 5, E45.002; 365/148; 438/382
See application file for complete search history.

(56) References Cited

U.S. PATENT DOCUMENTS

| 7,203,789 B2 | 4/2007 | Snider |
| 2008/0079029 A1 | 4/2008 | Williams |
| 2008/0090337 A1 | 4/2008 | Williams |
| 2009/0014707 A1 * | 1/2009 | Lu et al. ............... 257/4 |

OTHER PUBLICATIONS

Sakamoto, Toshitsugu et al.; "Three Terminal Solid-Electrolyte Nanometer Switch"; Electron Devices Meeting, 2005. IEDM Technical Digest IEEE International, Dec. 2005; 475-478; IEEE; USA.
Sakamoto, Toshitsugu et al.; "NanoBridge Technology for Reconfigurable LSI"; NEC Technical Journal; 2007; 72-75; vol. 2; No. 1.

* cited by examiner

*Primary Examiner* — Howard Weiss (57) ABSTRACT

A memristive device includes a first and a second electrode; a silicon memristive matrix interposed between the first electrode and the second electrode; and a mobile dopant species within the silicon memristive matrix which moves in response to a programming electrical field and remains substantially in place after the removal of the programming electrical field. A method for using a crossbar architecture containing a silicon memristive matrix includes: applying a programming electrical field by applying a voltage bias across a first conductor and a second conductor; a silicon memristive matrix containing mobile dopants being interposed between the first conductor and the second conductor, the programming voltage repositioning the mobile dopants within the silicon memristive matrix; and reading a state of the silicon memristive matrix by applying a reading energy across the silicon memristive matrix, the reading energy producing a measurable indication of the state of the silicon memristive matrix.

20 Claims, 7 Drawing Sheets

CRYSTALLINE SILICON-BASED MEMRISTIVE DEVICE WITH MULTIPLE MOBILE DOPANT SPECIES

BACKGROUND

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field. Typically changing dopant configurations within a matrix are exhibited as changes in the electrical resistance of the device.

Electrical devices that exhibit this "memory" of past electrical conditions through dopant based changes in electrical resistance have been called "memristors" or "memristive devices." Memristive behavior is most strongly evident in nanometer scale devices and could potentially be used for high density data storage, circuit calibration, or to provide self programming, fuzzy logic, or neural learning capabilities. One of the fundamental challenges of implementing memristive devices is to integrate them with complimentary circuitry to perform high level tasks.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

The presence of dopants within an insulating or semiconducting matrix can dramatically increase the electrical conductivity of the matrix. Dopants can be introduced into a matrix or moved within a matrix to dynamically alter the electrical operation of an electrical device. In some circumstances, the motion of dopants can be induced by the application of a programming electrical field across a suitable matrix. After removal of the electrical field, the location and characteristics of the dopants remain stable until the application of another programming electrical field.

There is a long felt but unfulfilled need for electrical components which retain a memory of past conditions. For example, these electrical components could be used to store data, calibrate circuits, or provide self programming, fuzzy logic, or neural learning capabilities. An example of such an electrical component may be a solid state memory device with high storage density, no power requirement for long term data retention, and fast access times. Other examples may include: switching devices, self programming circuit elements, memory devices capable of multi-state storage; solid state elements which can be used to tune circuits, analog neuronal computing devices which share fundamental functionalities with the human brain; and electronic devices for applying fuzzy logic processes.

Throughout the specification and appended claims, the term "memristor" or "memristive" is used to describe a combination of an insulating/semiconductor matrix and a dopant which exhibits dopant motion in the presence of a programming electrical field and the desired long term dopant stability within the matrix when the programming field is removed. The memristive effect is most strongly evident in nanometer scale devices and allows the device to "remember" past electrical conditions.

According to one illustrative embodiment, a memristive device may be a programmable resistor or "memristor." A memristor is the fourth fundamental circuit element, joining the capacitor, resistor, and inductor. The term "memristor" is derived from the combination of the two terms "memory" and "resistor." The memristor has properties that cannot be duplicated by the combination of the other fundamental circuit elements. Unlike the other fundamental circuit elements, the memristor carries a memory of past electrical fields which have been applied. As described in U.S. Patent App. Pub. No. 2008/0079029, entitled "Multi-terminal Electrically Actuated Switch" and U.S. Patent App. Pub. No. 2008/009033, entitled "Electrically Actuated Switch", both to R. Stanley Williams, which are hereby incorporated in their entirety, memristor devices are based on dopant motion within a matrix material. Specifically, when an electrical field of sufficient magnitude is applied to a memristor, the dopants within the matrix material are displaced. When the electrical field is removed from the circuit, the displacement of the dopants allows the memristor to "remember" how much voltage was previously applied and for how long. The motion of these dopants alters the electrical resistance of the memristor. The dopants remain in this displaced state over long periods of time, thereby retaining a memory of the past electrical fields applied to the device. Until another electrical field is applied to the memristor which has sufficient intensity or duration to induce dopant motion, the resistance characteristics of the memristor are stable.

The selection of a suitable matrix material and dopant species is challenging. Ideally, the matrix material and dopant would be compatible or at least relatively easy to incorporate into existing semiconductor processes. If the matrix material and dopant were compatible with silicon based manufacturing processes, the cost and development time required to incorporate memristive elements in integrated circuits would be significantly reduced. Additionally, the flexibility in using memristive devices would be significantly enhanced by integrating them with other conventional electronic elements in an integrated circuit.

The use of silicon as a memristive matrix material would increase the compatibility of memristive devices with current integrated circuit designs and processes. However, conventional wisdom and practice are to minimize the motion of dopants within silicon after manufacturing to prevent detrimental changes in characteristics of the silicon based circuits. In contrast, field-induced dopant motion within memristive devices is a desirable and required characteristic. Upon removal of the programming field, dopant stability is desirable for a given length of time. The dopant stability criteria in the absence of the programming electrical field can vary from application to application. For example, the desired stability may range from nanoseconds to tens of years. By carefully matching the matrix material and dopant species, the desired dopant motion during programming and dopant stability can be achieved.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

A crossbar is an array of switches that can connect each wire in one set of parallel wires to every member of a second set of parallel wires that intersects the first set (usually the two sets of wires are perpendicular to each other, but this is not a necessary condition). As used herein, the functional dimension of the device is measured in tens of nanometers (typically less than 50 nm), but the lateral dimensions may be nanometers, sub-microns or microns.

In the following description, for purposes of explanation, numerous specific details are set forth in order to provide a thorough as understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1A:
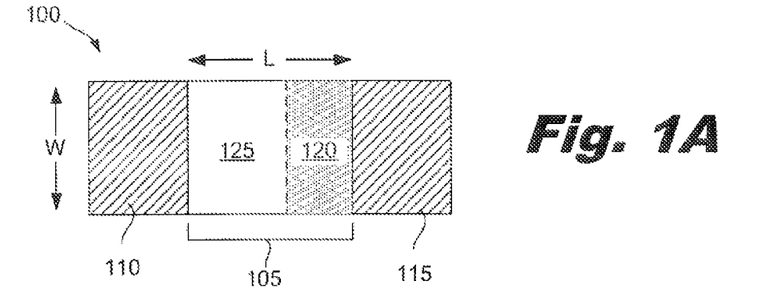
FIGS. 1A-1D are diagrams of the configuration and operation of one illustrative memristive device, according to one embodiment of principles described herein.

FIG. 1A shows an illustrative two-terminal memristive switch (100). According to one embodiment, the two-terminal memristive switch (100) is comprised of a first electrode (110) and second electrode (115) which are in electrical and physical contact with the memristive matrix (105). The memristive matrix (105) is comprised of an intrinsic semiconducting material (125) which is not intentionally doped and a highly doped secondary region (120). Throughout the specification and appended claims, the term "memristive matrix" describes a thin film of material that is electronically semiconducting or nominally electronically insulating and also a weakly ionic conductor. The memristive matrix is capable of transporting and hosting ions that act as dopants to control the flow of electrons through the switch. The basic mode of operation is to apply an electrical field (the drift field, which may exceed some threshold for enabling the motion of the ions in the memristive matrix) across the switch large enough to cause an ionic species to be transported within the memristive matrix via ionic transport. The ionic species are specifically chosen from those that act as electrical dopants for the memristive matrix, and thereby change the electrical conductivity of the matrix from low conductivity (i.e. not intentionally doped semiconductor or insulator—switch-OFF configuration) to high conductivity (doped to provide a higher conductivity—switch-ON configuration) or from high electrical conductivity to low conductivity (switch-ON to switch-OFF). Furthermore, the memristive matrix and the dopant species are chosen such that the drift of the dopants within the memristive matrix is possible but not too facile, to ensure that the switch will remain in whatever state it is set for a reasonably long time, perhaps many years at room temperature. This ensures that the switch is nonvolatile, that is, that it holds its state after the drift field has been removed.

The matrix material may be a thin film (generally less than 50 nm thick), and is in many cases nanocrystalline, nanoporous, or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid. Another advantage of nanometer scale memristive devices is that a large electrical field can be produced by a relatively small applied voltage. For example, a dopant may require an electrical field intensity of 100,000 volts per centimeter to move within the matrix. If the distance between two electrodes is 100 nanometers, only a voltage bias of 1 Volt will produce the required electrical field intensity.

There can be a variety of junctions within the memristive device where two dissimilar materials are joined to each other. For example, the memristive matrix can be contacted by electrodes which are made from metal or semiconductors. Additionally, within the matrix, regions with high concentrations of mobile dopants can contact regions which have been depleted of mobile dopants. In some cases, contact by dissimilar materials can deplete a doped material of free charge carriers, so in fact the doped material has a local net charge that depends on the identity of the dopants—positive in the case of donors and negative in the case of acceptors. These junctions electrically resemble Schottky barriers. The traditional description of a metal-semiconductor Schottky barrier is modified by the fact that the materials are structured at the nanometer scale, and so the structural and electrical properties are not averaged over the large distances over which the theory of semiconductor-metal contacts have been developed.

Conduction of electrons through the matrix material is frequently dominated by quantum mechanical tunneling of the electrons. When a semiconducting matrix material is essentially intrinsic, the tunneling barrier is high and wide, and thus the conductivity through the switch is low (OFF state). When a significant number of dopant species have been injected into or distributed throughout the semiconductor, the width and perhaps the height of the tunneling barrier are diminished by the potential of the charged species. This results in an increase of the conductivity of the switch (ON state).

As noted above, the matrix material has certain properties that are useful in the practice of the present invention. One of these properties of the material is that it is a weakly ionic conductor. The definition of a weakly ionic conductor is based on the application for which a switch is designed. The mobility and the diffusion constant for a species in a lattice are directly proportional to one another, via the "Einstein relation". Thus, if the mobility of ionized species in a lattice is very high, so is the diffusion constant. In general, it is desired for a switching device to stay in a particular state, ON or OFF, for an amount of time that may range from a fraction of a second to years, depending on the application. Thus, the diffusion constant for such a device is, in an embodiment, low enough to ensure the desired level of stability, to avoid inadvertently turning the device from ON to OFF or vice versa via ionized species diffusion, rather than by intentionally setting the state of the switch with a voltage pulse. Therefore, a "weakly ionic conductor" is one in which the ion mobility, and thus the diffusion constant, is small enough to ensure the stability of the ON or OFF state of the device for as long as necessary under the desired conditions (e.g., the device does not change state because of diffusion of the dopants). "Strongly ionic conductors" would have large ionized species mobilities and thus would not be stable against diffusion.

According to one illustrative embodiment, a silicon material may be used as a memristive matrix. For example, crystalline silicon, polycrystalline silicon, or amorphous silicon may be used. Advantages in using silicon material include easy integration into conventional Complimentary Metal-Oxide-Semiconductor (CMOS) as well as the availability mature processes and accumulated technology resulting from decades of silicon-based integrated circuit development. According to one illustrative embodiment, the memristive matrix is epitaxially deposited crystalline silicon.

According to one embodiment, the memristive matrix (105) may be initially comprised of two separate materials or layers. A first insulating layer (125) has very few dopants and prevents electrical current from flowing between the two electrodes (110, 115). A second highly doped layer (120) is conductive and serves as a source of dopants which can be moved into the first insulating layer (125) to change the overall electrical conductivity of the memristive matrix (105). Consequently, in the configuration illustrated in FIG. 1A, the memristive switch (100) is open.

The memristive matrix (105) has a length of "L" and a width of "W" as shown in FIG. 1A. For purposes of illustration only, assume that the length "L" is 100 nanometers and the width "W" is approximately 50 nanometers. Consequently, to apply an electrical field of 100,000 volts/centimeter across the memristive material (105), a voltage bias of 1 volt would be applied across the electrodes (110, 115).

The dopants may originate from a variety of sources. The matrix material (105) may be initially formed with a number of dopants distributed throughout the matrix. A programming electrical field can then be used to displace the dopant to form intrinsic regions and doped regions within the matrix. In other embodiments, the matrix material (105) may be deposited in its intrinsic form. A sacrificial layer is then deposited onto the intrinsic material which provides the dopants by chemically reacting with the intrinsic matrix.

In an alternative embodiment, the matrix (105) may be made with an intrinsic layer and a separate doped layer. The application of a programming electrical field to the memristive device then allows the dopants to be distributed as desired throughout the matrix. Additionally or alternatively, a dopant source particles or layers may be included in the memristive device. The dopant source particles or layers may act as a source of dopants in a variety of ways. For example, the dopant source particles or layers may have the ability to generate large numbers of dopants under the influence of an external field of high enough strength. Typically, this electrical field is much higher than the programming electrical field. Additionally, a passivation layer may be formed over a memristive device to prevent atmospheric oxygen or other contaminants from chemically altering the composition of the memristive device The electrodes (110, 115) may be constructed from a variety of conducting materials, including but not limited to: metals, metal alloys, highly doped semiconductors, composite materials, nanostructured materials, or other suitable materials. According to one illustrative embodiment, the electrodes are formed from platinum.

Figure 1B:
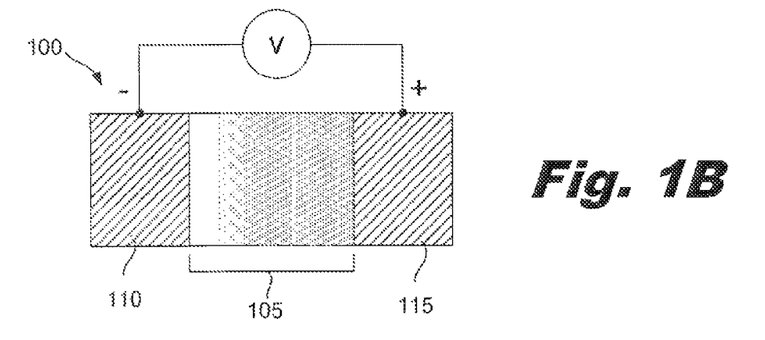

FIG. 1B illustrates the movement of dopants from the highly doped region (120) into the intrinsic region (125) as a result of an applied electrical field. The polarity and voltage difference which is applied across the memristive matrix (105) may vary according to a variety of factors including, but not limited to: material properties, geometry, dopant species, temperature, and other factors. A negative voltage may also be applied to the left electrode (110) to further increase the electrical field and draw the positively charged vacancies toward the left electrode (110).

Figure 1C:
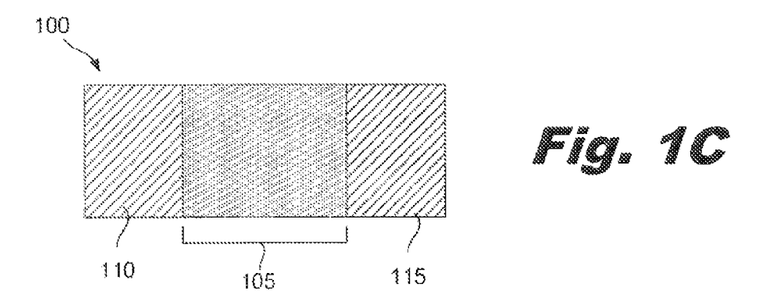

FIG. 1C illustrates the memristive switch in the fully "ON" position, with the dopants fully distributed throughout the memristive matrix (105). The left and right electrodes (110, 115) are electrically connected and can pass lower voltage electrical signals through the memristive matrix (105). As discussed above, the location and distribution of the dopants can remain stable over long periods of time or until another programming voltage is applied. The memristive matrix (105) is not a perfect conductor and still interposes an electrical resistance between the two electrodes (110, 115) in the fully "ON" state. This electrical resistance may be influenced by a variety of factors, including, but not limited to the geometry of the memristive matrix and the electrodes, the dopant concentration, the distribution of the dopants throughout the memristive matrix, the species of dopant, the electrical characteristics of the matrix material, the temperature of the device, and other factors.

Figure 1D:
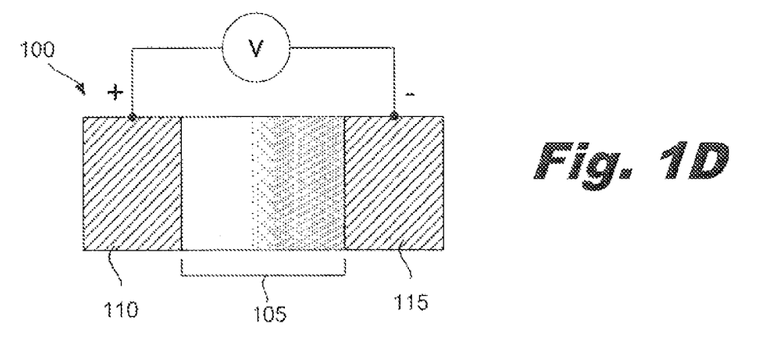

FIG. 1D illustrates the application of a programming voltage to the memristive switch (100). In this case, the purpose of the programming voltage is to return the memristive switch (100) to the fully "OFF" configuration similar to that illustrated in FIG. 1A. Consequently, the applied programming voltage has an opposite polarity from that illustrated in FIG. 1B. A positive voltage is applied to the left electrode (110) and negative voltage is applied to the right electrode (115), thereby driving the dopants toward the right electrode (115). This returns the left most portion of the memristive matrix (105) to its intrinsic and insulating state. The memristive switch (100) is then in a fully "OFF" configuration.

The transition from the fully "OFF" to fully "ON" configuration or visa versa, is not instantaneous, but can have a number of intermediate states in which the memristive matrix acts as a finite resistance between the two electrodes. These intermediate states may be produced by varying the programming voltage applied across the two electrodes (110, 115) and/or varying the time period during which the programming voltage is applied.

In some circumstances, it can be desirable for the memristive matrix to retain some electrical resistance. For example, in the fully "ON" configuration illustrated in FIG. 1C, if the resistance of the memristive matrix (105) is negligible, the two electrodes (110, 115) and the memristive matrix (105) can be thought of as a single electrical conductor. The application of a programming voltage across the two electrodes (110, 115) results in a large flow of current through the switch, but very low voltage difference between the two electrodes (110, 115). Consequently, the electrical gradient between the left and right electrodes (110, 115) is small, making it very difficult move the dopants away from either electrode. This would result in the memristive switch (100) being permanently stuck in a fully "ON" or short circuited configuration.

Intrinsic silicon can be doped with a variety of impurity atoms (dopants). These dopant atoms alter the electrical properties of the silicon and form the basis of silicon resistor, diode, and transistor behavior. Typically the dopants act as charge carriers by accepting or donating free electrons. Consequently, the electrical conductivity of silicon increases with higher dopant concentrations. Lightly and moderately doped silicon is referred to as "extrinsic" silicon. Silicon that is doped to such high levels that it acts as an electrical conductor is referred to as "degenerate" silicon.

Dopant atoms may be added to silicon in a variety of ways. Some dopants are added as the silicon material is grown, which results in an almost uniform initial doping. Silicon may also be doped by molecular diffusion, often called simply "diffusion," which is a net transport of molecules from a region of higher concentration to one of a lower concentration. Additionally, ion implantation can be used to precisely deposit dopants within the silicon. Ion implantation typically involves generating ions of the desired dopant species, accelerating the ions, and then directing the ion stream to the silicon surface. At low kinetic energies, the penetration of the ions into the silicon is minimal. At higher kinetic energies the ions penetrate and become imbedded in silicon material.

Figure 2A:
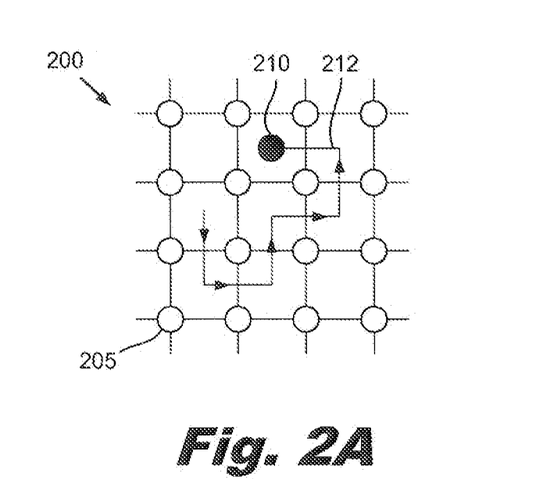
FIGS. 2A and 2B are diagrams showing dopant diffusion mechanisms through a crystalline silicon matrix, according to one embodiment of principles described herein.

The dopants within a crystalline silicon material can move within the lattice using a variety of methods. FIG. 2A is a diagram showing motion of a dopant atom (210) moving through a silicon crystal lattice (200) via an interstitial mechanism. The silicon crystal lattice (200) is made up of silicon atoms (205) that have bonds (indicated by the straight lines between the silicon atoms) with the surrounding silicon atoms. Within the silicon crystal lattice (200), the silicon atoms (205) form a regular geometric pattern, with the individual silicon atoms being separated from the adjacent silicon atoms by an interstitial distance. Silicon is a four-fold coordinated atom that is normally tetrahedrally bonded to four neighboring silicon atoms. In crystalline silicon this tetrahedral structure is continued over a large range, forming a well ordered lattice (crystal). A dopant (210) may move between the silicon atoms by passing through the interstitial spaces. In FIG. 2A, an illustrative path (212 of the dopant (210) through the interstitial spaces in the lattice is illustrated. The motion of the dopant atom (210) is shown by the various arrows along the interstitial path (212).

Figure 2B:
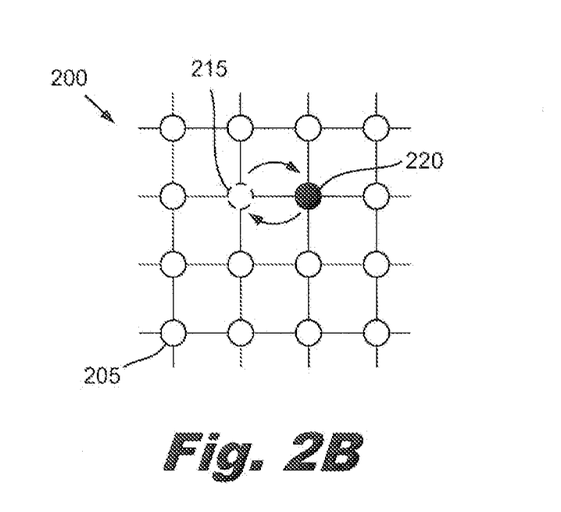

FIG. 2B is a diagram which illustrates the vacancy motion or substitution motion of a dopant atom (220) through a crystalline silicon matrix (200). A vacancy refers to the absence of a silicon atom within the crystalline silicon. In vacancy motion, the dopant atom (220) exchanges its current position with a neighboring vacancy (215). To avoid oscillations of this exchange procedure, the vacancy (215) must move to at least a third neighbor site away from the dopant. This may provide another dopant atom with the opportunity to move through the lattice. Using a number of vacancies, the long-range migration of the dopant species within the lattice can take place.

The substitution mechanism is similar to the vacancy mechanism described above, except instead of the dopant atom trading places with a vacancy, the dopant atom exchanges places with a neighboring silicon atom. In some cases, the dopant atom may force the silicon atom to an interstitial position.

The magnitude and motion of dopants is strongly influenced by the dopant species, dopant concentrations, and temperature. For example, arsenic, germanium, and boron move primarily using vacancy mechanisms. Other dopants, such as lithium, iron, sodium, and potassium move using primarily interstitial mechanisms. Various dopant species can diffuse through the silicon lattice under given conditions using one or more of a number of mechanisms. The examples given above are merely to illustrate that a given dopant species may have a preferred diffusion mechanism.

A variety of other considerations may influence the motion of a dopant species. Concentrations of dopants within the crystal lattice can increase or decrease the diffusion of a dopant species. For example, the size mismatch between a diffusing species and the silicon lattice can result in lattice strain which may enhance the diffusivity of a co-diffusing species. Further, the diffusion mechanism of a single dopant species can change based on its concentration within the lattice. For example, a dopant species may primarily use interstitial motion for low dopant concentrations but for high concentrations the dopant species may use a dual mechanism that combines interstitial motion with a strong vacancy component.

Increases in the temperature of the silicon matrix result in increased diffusivity of the dopants. For example, increasing the temperature of the matrix increases the relative vibration of the silicon atoms which make up the matrix. This may enlarge the effective interstitial distance and make it easier for individual silicon atoms, dopants atoms, or vacancies to be displaced within the lattice.

Figure 3:
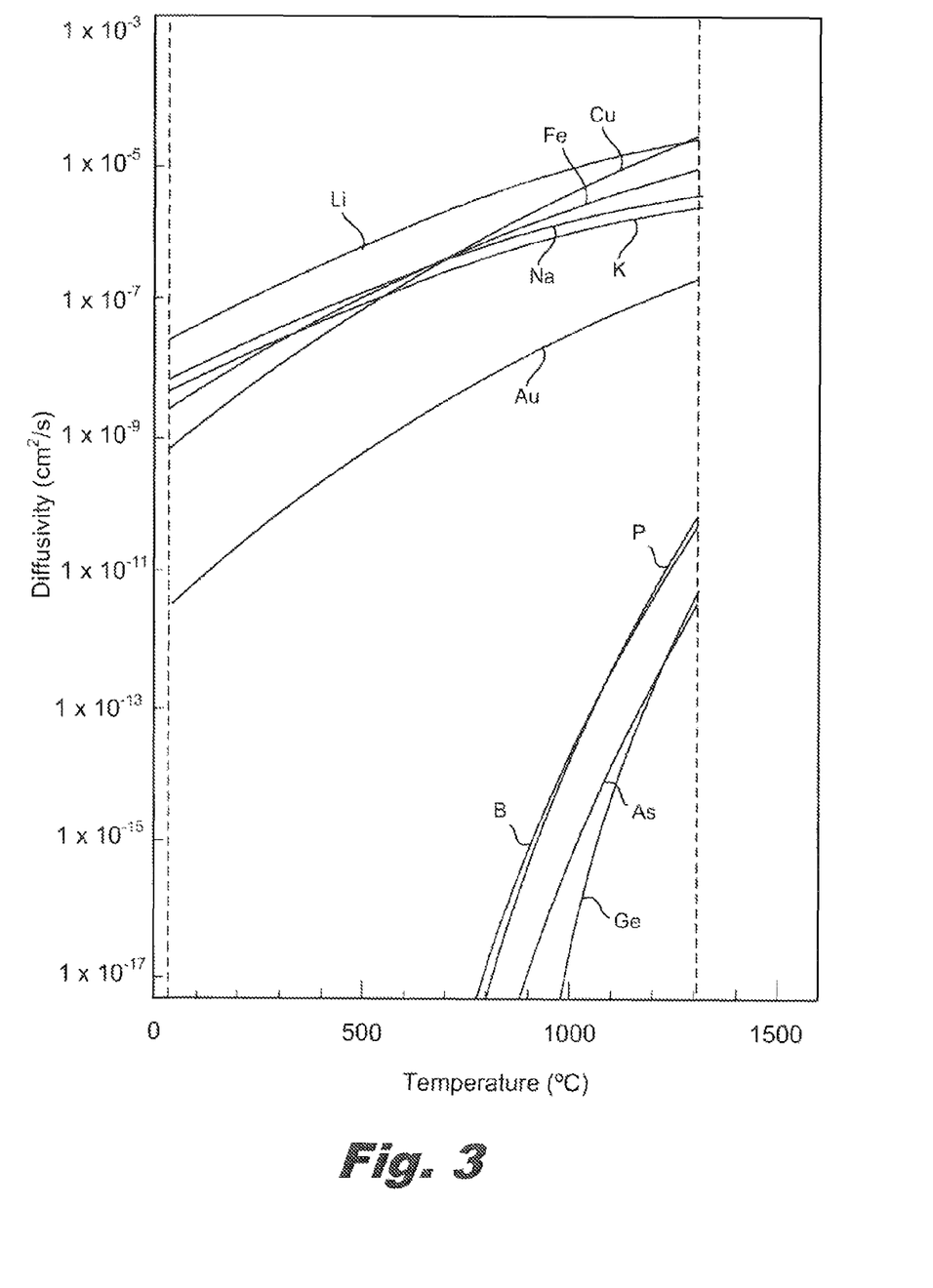
FIG. 3 is a graph showing diffusivity of various dopant species through a crystalline silicon matrix as a function of temperature, according to one embodiment of principles described herein.

FIG. 3 is a graph showing diffusivity of various dopant species through a crystalline silicon matrix as a function of temperature. The vertical axis of the graph shows the diffusivity in centimeters squared per second ($cm^2/s$), starting with diffusivities of $1 \times 10^{-17}$ $cm^2/s$ at the lower end of the axis and showing increasing diffusivities higher on the axis. Temperatures in Celsius are shown along the horizontal axis, with zero degrees Celsius shown on the left and 1600 degrees Celsius on the right. Curves on the graph represent the diffusivities of various dopants in crystalline silicon over a range of temperatures. The graph is intended only to illustrate qualitative differences between various species of dopants and not to communicate quantitative values for diffusivities.

In general, dopant species which move through the crystalline silicon matrix using interstitial mechanisms have higher diffusivities than those that diffuse using vacancy or substitution mechanisms. For example, Lithium (Li), Iron (Fe), Sodium (Na), potassium (K), Copper (Cu), and Gold (Au) primarily move through the crystalline silicon matrix using interstitial mechanisms and have relatively higher diffusivities. Curves representing these dopants are labeled with the appropriate element abbreviation and fall in the upper portion of the graph. Boron (B), Phosphorus (P), and Arsenic (As) primarily move via substitution or vacancies mechanisms. These and other dopants exhibit lower diffusivities and are shown in the lower portion of the graph.

In conventional silicon devices, the dopants are deposited in precise locations and concentrations. If diffusion of the dopants is desired, the then the silicon matrix is typically heated to increase and control the dopant diffusivity. The diffusion process is carefully monitored and follows a controlled temperature profile. Following the manufacturing process, the silicon device is subjected only to ambient and operating temperatures, which are substantially lower than temperatures during the diffusion processes. The dopants are expected to remain substantially immobile within the silicon matrix at ambient and operating temperatures to prevent undesirable change in the electrical properties of the device. Consequently, dopants with high diffusivities (such as lithium, iron, sodium and potassium) are avoided in conventional silicon devices to preclude undesirable changes at ambient or operating temperatures.

However, in memristive devices, the dopant species are chosen such that the drift of the dopants within the memristive matrix is possible but not too facile, to ensure that the switch will remain in whatever state it is set for a reasonably long time. This ensures that the switch is nonvolatile, that is, that it holds its state after the drift field has been removed. As a result, dopant species that move via interstitial mechanisms, such as lithium, iron, sodium and potassium, may be appropriate for some memristive applications. For example, in some applications, the desired time period for nonvolatility may be on the order of minutes or hours. In other situations, the desired time period for nonvolatility may be many years. In some memristive applications, some diffusion of the dopant during the desired time period may be acceptable. For example, in a memory application which uses a memristive device to store a binary value (i.e. a "1" or a "0"), the dopants must only remain stable enough over the time period to allow the reading circuitry to distinguish between a "1" and a "0" entry. Consequently, there may be some allowable dopant drift during the latent time period.

Another consideration in selecting an appropriate dopant for use within a silicon memristive matrix is the solubility of the dopant within a crystalline silicon matrix. Solubility refers to the maximum amount of dopant which can be present within the crystalline silicon matrix at a given temperature. If the solubility limit is exceeded, the dopant precipitates out of the solution and forms a second phase.

Figure 4:
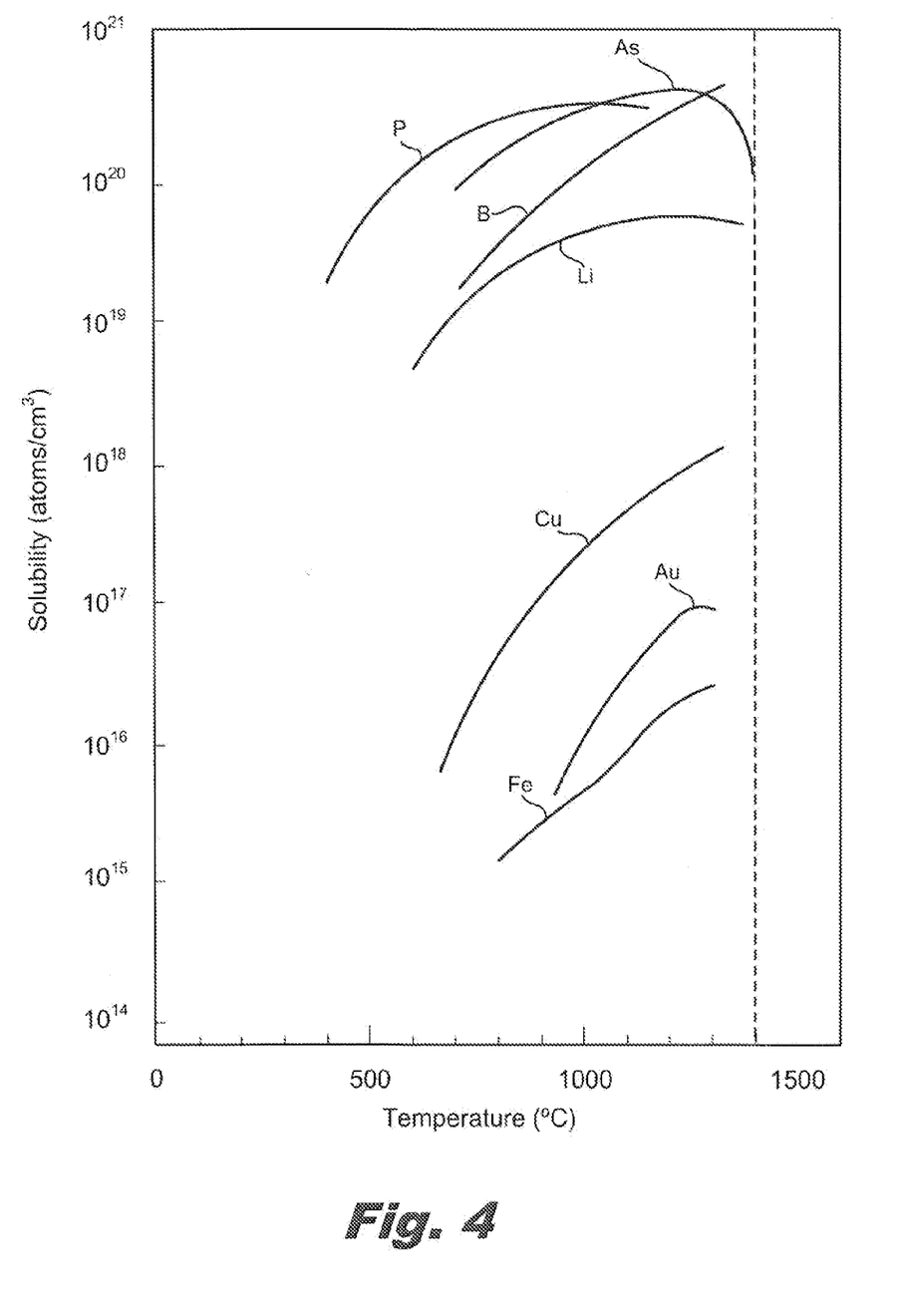
FIG. 4 is a graph shown the solubility of various dopant species through a crystalline silicon matrix as a function of temperature, according to one embodiment of principles described herein.

FIG. 4 is a graph which shows the solubility of various dopant species through a crystalline silicon matrix as a function of temperature. The vertical axis of the graph shows solubility in atoms per cubic centimeter (atoms/cm$^3$), starting with solubilities of $1 \times 10^{14}$ atoms/cm$^3$ at the lower end of the axis and showing increasing diffusivities higher on the axis. Temperatures in Celsius are shown along the horizontal axis, with zero degrees Celsius shown on the left and 1600 degrees Celsius on the right.

In general, dopants that tend to be located within the interstitial spaces in the silicon crystal tend to have lower solubilities. For example, Copper (Cu), Gold (Au), and Iron (Fe) typically move via interstitial mechanisms and reside in interstitial spaces. Lithium (Li) is an outlier in this group and has a higher solubility than some interstitial dopants.

The dopants that tend to be located within point defects or to substitute positions with silicon atoms generally have higher solubilities. For example, the solubility curves for phosphorus (P), arsenic (As), and Boron (B) are clustered in the upper portion of the chart.

In general, the higher the solubility of a dopant species, the more dopant atoms can be present within the silicon lattice. For a memristive device, higher concentrations of dopants may or may not result in an increase in the utility of the device. For example, a dopant that has a high solubility may be beneficial when a memristive device is configured to store dopants in a small volume in a first state and distribute the dopants over a larger area in a second state. However, if high dopant concentrations interfere with the motion of the dopant or stability of the memristive device, a lower number of dopant atoms may be used or a different dopant species may be selected.

A third consideration in selecting a dopant species for a memristive device relates to the tendency of the dopant to precipitate out of the matrix material. When a dopant precipitates out of the matrix material, the dopant species can form regions of a secondary material which could disrupt the operation of the memristive device. For example, copper (Cu) is moderately soluble within a crystalline matrix at temperatures above 600 degrees Celsius. However, the solubility of copper at room temperature is significantly lower. At room temperatures, copper has a well known tendency to precipitate out of silicon matrix and form secondary materials within the matrix. In some circumstances this may be desirable. For example, a layer within the memristive matrix could be highly doped with copper using thermal diffusion. Upon returning to room temperature, the copper dopants precipitate from the material and form a secondary material. This secondary material could serve as a reservoir from which dopants could be drawn as desired. In circumstances where secondary materials within the matrix are not desired, lower concentrations of copper dopants may be used or a different dopant could be selected. For example, iron has a lower solubility than copper for higher temperatures but does not easily precipitate out of the silicon matrix at lower temperatures.

The discussion above refers to specific dopants to illustrate various considerations in selecting a dopant for use within a silicon-base memristive device. However, a variety of other dopants may be used. By way of example and not limitation, the dopants may be various group III and V elements, metallic elements, lattice defects, or the like.

The preceding discussion of dopants relates primarily to dopant motion through a silicon matrix which has very few large scale disruptions to the crystal lattice. The dopant diffusion occurs within the constraints of the lattice. In less ordered silicon structures, dopant motion can be dominated by different diffusion mechanisms. For example, diffusion in polycrystalline materials occurs primarily along grain boundaries and is highly dependent on the grain size.

Figure 5:
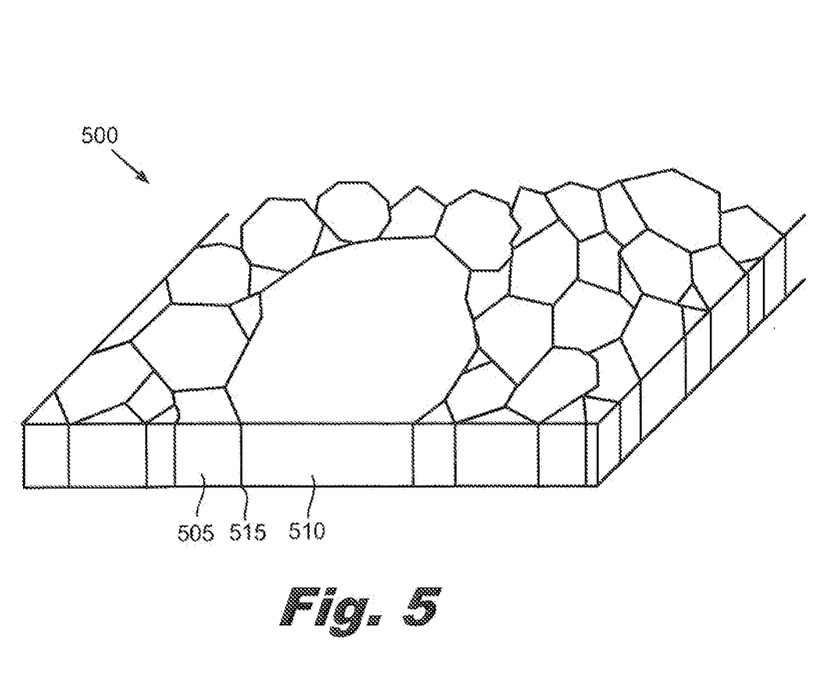
FIG. 5 is a diagram of crystalline grains within an illustrative polycrystalline silicon thin film, according to one embodiment of principles described herein.

FIG. 5 is a diagram of crystalline grains (505, 510) within an illustrative polycrystalline silicon thin film (500). Polycrystalline silicon consists of multiple small silicon crystals or grains (505, 510). Within the grains (505, 510), the crystalline lattice is generally uniform. However, at edges of the grains, the crystalline order breaks down and undergoes a much less ordered transition to the next grain. This disordered transition region is called a grain boundary (515). Dopants can move relatively freely along grain boundaries because of the large vacancies and lack of uniform bonds between adjoining silicon atoms. In general, the diffusion of dopants through grain boundaries can be several orders of magnitude greater than diffusion through a crystalline lattice inside a grain. Consequently, the diffusion of dopants through a polycrystalline silicon matrix is highly dependent on the number and orientation of grain boundaries. In general, the more grain boundaries that are present, the higher the diffusivity of dopants within the material. For nanoscale memristive devices which have overall dimensions on the same order of magnitude as grains within a polycrystalline silicon matrix, the diffusivity of dopants can be highly variable. For example, a first memristive device may have a matrix that comprises a single grain while a second memristive device may have several grain boundaries which run from one electrode to another. The first memristive device would exhibit far different characteristics than the second. Thus, polycrystalline silicon may be effectively used to vary the characteristics of the memristive device by carefully controlling the grain size and distribution. In circumstances where variations in performance a group of memristive devices is desired or can be tolerated, less attention to the grain size and distribution may be acceptable.

Amorphous silicon may also be used as a memristive silicon matrix. Amorphous silicon lacks the long range order of crystalline silicon and the short range order of polycrystalline silicon. Instead, the silicon atoms form a continuous random network in which not all of the silicon atoms are four-fold coordinated. Due to the disordered nature of the material, a comparatively large number of silicon atoms have an unused covalent bond (a dangling bond). The dangling bonds and disordered state of the amorphous silicon introduce a number of variables which could be advantageously used within a memristive device. For example, the dangling bonds could be terminated using any of a number of elements. These terminating elements could provide diverse characteristics such as light sensitivity or interaction with dopant atoms. Additionally, the degree of randomness within the amorphous silicon could be varied to control diffusivity of one or more dopant species. In some circumstances, the degree of randomness within the silicon may preferentially influence one species of dopant while having a different or lesser effect on a second dopant species. Further, the randomness may influence the overall solubility of dopants.

For a given circumstance, the type of silicon matrix and one or more dopants can be selected to fulfill the desired function. For example, in a transistor application, a crystalline silicon memristive matrix may be selected and doped with a relatively immobile dopant that is an electron acceptor. A second mobile dopant which is an electron donor can then be distributed across the memristive matrix such that it transects the memristive matrix. This forms a PNP junction that could function as a transistor.

In a neural network or synapse application, the properties of an amorphous or polycrystalline silicon matrix may be desirable. For example, the manufacturing process may produce amorphous silicon that generates a wide range of variability in the memristive synapses. This variation could be leveraged to apply fuzzy logic or learning algorithms. In other cases, amorphous silicon could be combined with dopant species that are not compatible with or that do not exhibit the desired properties in crystalline silicon. Additionally or alternatively, one or more variables within manufacturing process may be carefully controlled to produce substantially uniform memristive devices with properties that are not available using crystalline silicon.

Silicon-based memristive devices may be integrated into larger structures to serve as configurable elements that are nonvolatile over long time periods. For example, silicon-based memristive devices may be utilized within an integrated circuit as variable resistors, switches, or multiplexers/de-multiplexers. These components could allow for configuration or tuning the circuit after manufacture, self healing, or optimization of the circuit to meet a specific need. After the application of a programming electrical field, the silicon-based memristive devices maintain their configuration without the need for power, resulting in the potential for "instant on" configurations.

In one application, a silicon-based memristive element may be interposed between two conductors and control the interaction between the two conductors. For example, the memristor may act as a binary switch which allows or prevents the flow of electrical current through between the two conductors.

Figure 6A:
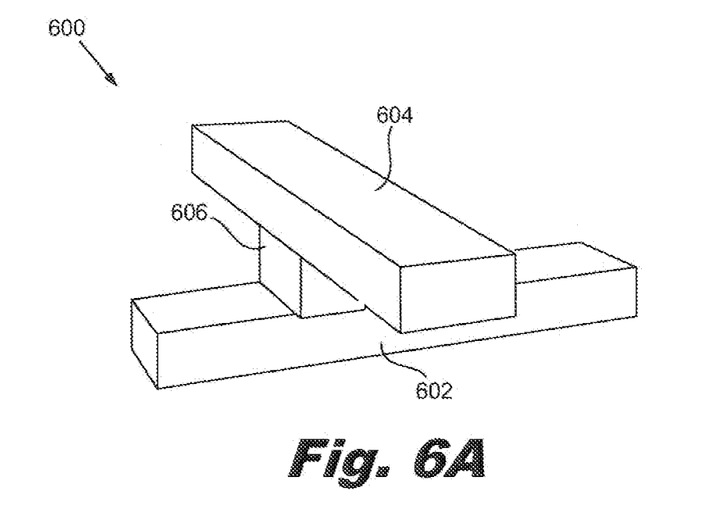
FIGS. 6A and 6B are diagrams of an illustrative crossbar architecture which incorporates silicon based memristive devices at the intersections of the conductors, according to one embodiment of principles described herein.

FIG. 6A illustrates an example of a memristive solid-state switch (600) connecting two different crossed wires (602, 604). A switch junction (606) may be used to connect the two different wires (602, 604). According to one illustrative embodiment, the switch junction (606) may be comprised of a silicon memristive matrix containing one or more mobile dopants. In a first configuration, mobile dopants may be distributed through the memristive switch (600). The mobile dopants act as charge carriers and significantly increase the electrical conductivity of the memristive switch (600). To change configurations, a programming electrical field may be applied across the switch junction (606) which drives the dopants to one side of the silicon matrix. In this second configuration, the switch is in its disconnected state.

Figure 6B:
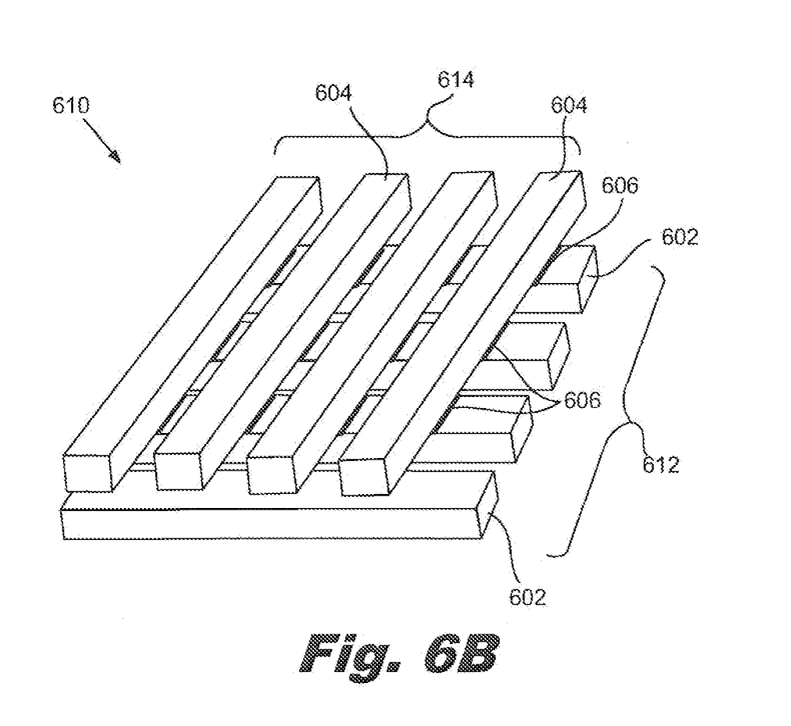

FIG. 6B illustrates a crossbar array (610) employing a plurality of the solid-state switches (600) shown in FIG. 6A. As shown in FIG. 6B, a first layer (612) of approximately parallel wires (602) is overlain by a second layer (614) of approximately parallel wires (604). The second layer (614) is roughly perpendicular, in orientation, to the wires of the first layer (612), although the orientation angle between the layers may vary. The two layers of wires (612, 614) form a lattice, or crossbar, each wire (604) of the second layer (614) overlying all of the wires (602) of the first layer (612) and coming into close contact with each wire of the first layer (612) at wire intersections that represent the closest contact between two wires. The switch junction (606) is shown disposed between wires (602, 604). Only three of the switch junctions (606) are labeled, so as not to clutter the drawing; it will be appreciated that a switch junction (606) can be formed at each intersection of a wire (602) with a wire (604). Such crossbars may be fabricated from micron-, submicron- or nanoscale-wires, depending on the application.

Although individual wires (602, 604) in FIGS. 6A and 6B are shown with square or rectangular cross-sections, wires can also have circular, elliptical, or more complex cross-sections. The wires may also have many different widths or diameters and aspect ratios or eccentricities. The term "nanowire crossbar" may refer to crossbars having one or more layers of sub-microscale wires, microscale wires or wires with larger dimensions, in addition to nanowires.

The examples illustrated above are primarily directed to two terminal devices. The silicon-based memristive devices could also incorporate three terminals, four terminals, or more. Each of these terminals may be capable of producing an electrical field which influences the position of the dopants within the silicon matrix. Consequently, two or more programming electrical fields may be present within the same device. This provides multiple degrees of freedom in manipulating the dopant distribution within the silicon matrix.

Further, multiple terminals may be used to access electrically conductive paths created by high dopant concentrations within the silicon matrix. For example, a multi-terminal silicon-based memristive device may be used as a multiplexer, de-multiplexer, or rotary switch. In some embodiments, a portion of the terminals may be electrically insulated from the silicon matrix and serve only as programming electrodes.

Figure 7:
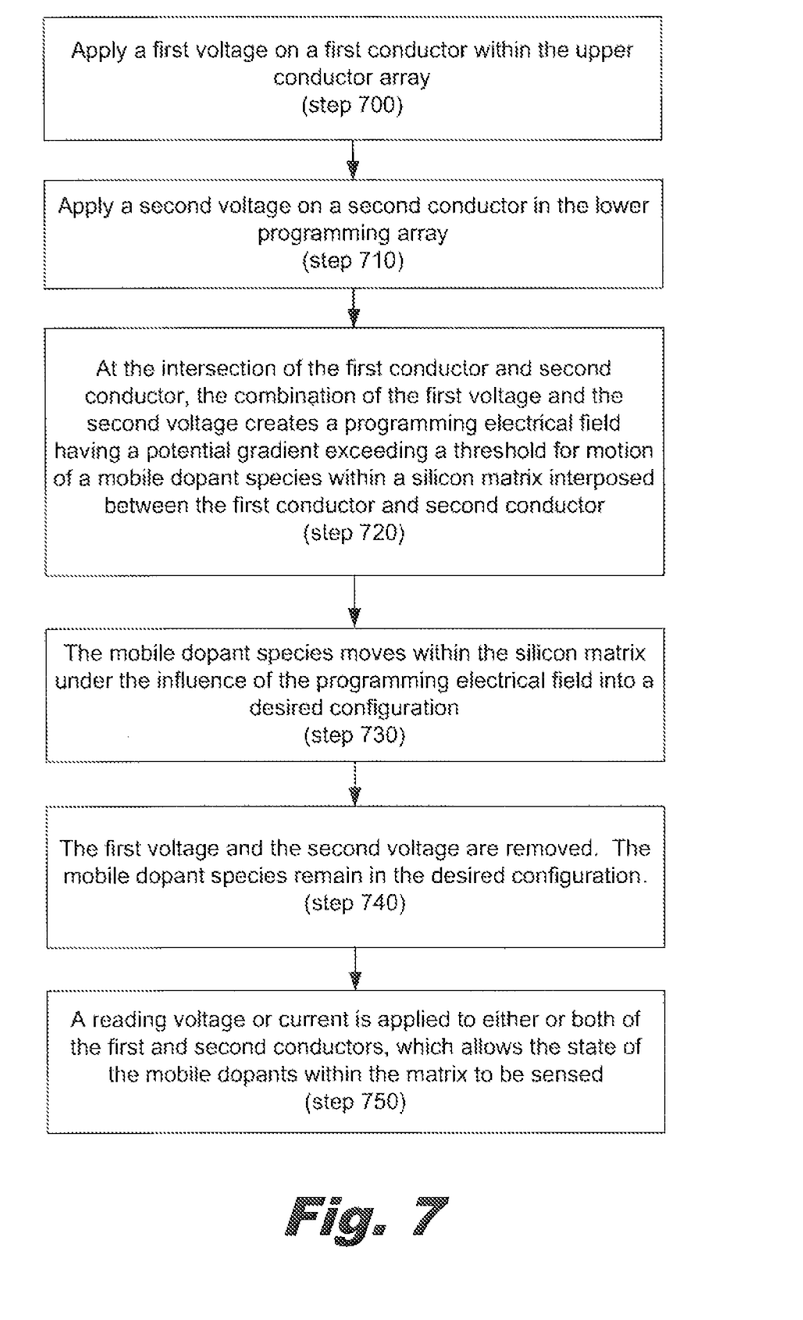
FIG. 7 is a flowchart showing one illustrative method for programming and reading a silicon-based memristive device incorporated into a crossbar architecture, according to one embodiment of principles described herein.

FIG. 7 is a flowchart showing one illustrative method for programming and reading a silicon-based memristive device incorporated into a crossbar architecture. In a first step, a first voltage is applied to a first conductor within the upper conductor array (step 700). Next a second voltage is applied on a second conductor in the lower programming array (710). At the intersection of the first conductor and second conductor, the combination of the first voltage and second voltage creates a programming electrical field which has a potential gradient exceeding the threshold for motion of a mobile dopant within a silicon matrix interposed between the first conductor and second conductor (step 720). For example, the first voltage may be a positive or negative voltage and the second voltage may be a ground voltage. The mobile dopant species moves within the silicon matrix under the influence of the programming electrical field into a desired configuration (step 730). The first voltage and the second voltage are then removed. The mobile dopant species remains in the desired configuration after removal of the programming electrical field (step 740). A reading voltage or current is then applied to either or both of the first and second conductors, which allows the state of the mobile dopants within the matrix to be sensed (step 750). For example, a reading voltage could be applied over a first conductor and the resulting current which passes through the silicon matrix may be sensed on the first or second conductor. Alternatively, a constant current may be passed through the memristive device and the resulting voltage difference measured on one or both of the first and second conductors.

In sum, a silicon memristive matrix may be used in combination with one or more dopant species. The resulting silicon-based memristive device can be significantly more compatible with existing manufacturing techniques and more easily integrated into silicon based integrated circuits. This will allow the benefits of memristive devices, including "instant on" chips, ultra-dense nonvolatile memory, smaller size, lower power consumption, and self-optimizing circuits, to be more readily realized within electronic devices.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memristive device comprising:
   a first electrode;
   a second electrode;
   a crystalline silicon memristive matrix interposed between said first electrode and said second electrode; and
   a mobile dopant species within said silicon memristive matrix; said mobile dopant species moving within said silicon memristive matrix in response to a first programming electrical field, said mobile dopant species remaining substantially in place after removal of said first programming electrical field.

2. The device of claim 1, wherein said mobile dopant species remains substantially in place during application of a reading energy; said reading energy allowing a state of said memristive device to be read.

3. The device of claim 1, wherein said mobile dopant species is at least one of potassium, sodium, lithium, and iron.

4. The device of claim 1, wherein said memristive device comprises multiple electrodes, said multiple electrodes being configured to generate a second programming electrical field such that both said programming electrical field and said second programming electrical field are present within said silicon memristive matrix.

5. The device of claim 1, wherein said mobile dopant species is primarily located in interstitial spaces in a crystal lattice of said silicon memristive matrix.

6. The device of claim 1, wherein said memristive device is a switch, said switch routing electrical current between two or more electrodes.

7. The device of claim 1, further comprising a crossbar architecture, said crossbar architecture comprising an upper conductor array and a lower conductor array, said silicon memristive matrix containing said mobile dopant species being interposed between said upper conductor array and said lower conductor array at intersections between individual conductors within said upper conductor array and individual conductors within said lower conductor array.

8. The device of claim 7, wherein said memristive device is a memory array.

9. The device of claim 1, wherein said silicon memristive matrix comprises two separate material layers, a first material layer of said silicon memristive matrix being an insulating layer and comprising less of said mobile dopant species than a second material layer being a conductive layer and serving as a source of dopants that can be moved into the first material layer to change an overall electrical conductivity of said memristive matrix.

10. The device of claim 1, wherein said memristive device is a multi-state device having three or more states distinguishable through application of a reading energy.

11. A memristive device comprising:
    a first electrode;
    a second electrode;
    a silicon memristive matrix interposed between said first electrode and said second electrode; and
    a mobile dopant species within said silicon memristive matrix; said mobile dopant species moving within said silicon memristive matrix in response to a first programming electrical field, said mobile dopant species remaining substantially in place after removal of said first programming electrical field;
    further comprising two or more mobile dopant species within said silicon memristive matrix.

12. The device of claim 11, wherein said memristive device is a multi-state device having three or more states distinguishable through application of a reading energy.

13. The device of claim 11, wherein said silicon memristive matrix is one of: crystalline silicon, polycrystalline silicon, and amorphous silicon.

14. The device of claim 13, wherein said silicon memristive matrix is amorphous silicon, characteristics of said amorphous silicon being tuned to match a mobile dopant species contained in said amorphous silicon, said characteristics being at least one of randomness, impurity concentration, or dopant concentration.

15. The device of claim 11, wherein said mobile dopant species comprise at least one of potassium, sodium, lithium, and iron.

16. The device of claim 11, wherein said memristive device comprises multiple electrodes, said multiple electrodes being configured to generate a second programming electrical field such that both said programming electrical field and said second programming electrical field are present within said silicon memristive matrix.

17. A method for using a crossbar architecture containing a silicon memristive matrix comprising:
    applying a programming electrical field by applying a first voltage on a first conductor within a first conductor array and applying a second voltage on a second conductor within a second conductor array, said first conductor intersecting a plurality of conductors within said second conductor array including said second conductor; a silicon memristive matrix containing mobile dopants being interposed between said first conductor and said second conductor, said programming voltage repositioning said mobile dopants within said silicon memristive matrix by causing said mobile dopants to diffuse throughout said silicon memristive matrix thereby changing a resistivity of said silicon memristive matrix; and
    reading a state of said silicon memristive matrix by applying a reading energy across said silicon memristive matrix, said reading energy producing a measurable indication of said state of said silicon memristive matrix.

18. The method of claim 17, wherein said silicon memristive matrix is one of: crystalline silicon, polycrystalline silicon, and amorphous silicon.

19. The method of claim 17, wherein said silicon memristive matrix is an epitaxially deposited crystalline layer.

20. The method of claim 17, wherein said silicon memristive matrix is amorphous silicon, characteristics of said amorphous silicon being tuned to match a mobile dopant species contained in said amorphous silicon, said characteristics being at least one of randomness, impurity concentration, or dopant concentration.

\* \* \* \* \*